(12) United States Patent
Kim et al.

(10) Patent No.: US 9,299,444 B1
(45) Date of Patent: Mar. 29, 2016

(54) NONVOLATILE MEMORY DEVICE WITH IMPROVED VOLTAGE DROP AND METHOD OF DRIVING THE SAME

(71) Applicant: SK hynix Inc., Icheon-si Gyeonggi-do (KR)

(72) Inventors: Nam Kyeong Kim, Icheon-si (KR); Duck Ju Kim, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/587,151

(22) Filed: Dec. 31, 2014

(30) Foreign Application Priority Data

Sep. 24, 2014 (KR) .................. 10-2014-0127537

(51) Int. Cl.
*G11C 16/10* (2006.01)
(52) U.S. Cl.
CPC .................................... *G11C 16/10* (2013.01)
(58) Field of Classification Search
None
See application file for complete search history.

(56) References Cited

U.S. PATENT DOCUMENTS

| 7,239,556 | B2* | 7/2007 | Abe et al. ................. 365/185.33 |
| 9,082,642 | B2* | 7/2015 | Kim et al. |
| 2009/0225599 | A1* | 9/2009 | Futatsuyama ............ 365/185.11 |
| 2009/0231318 | A1* | 9/2009 | Lee ............................... 345/211 |
| 2012/0236619 | A1* | 9/2012 | Kutsukake et al. ............. 365/72 |

FOREIGN PATENT DOCUMENTS

| KR | 100642907 B1 | 10/2006 |
| KR | 1020140086566 A | 7/2014 |

* cited by examiner

*Primary Examiner* — Harry W Byrne
*Assistant Examiner* — Sultana Begum
(74) *Attorney, Agent, or Firm* — William Park & Associates Ltd.

(57) ABSTRACT

A nonvolatile memory device includes a block switching unit which transmits an operation signal to a memory cell array, and a voltage sustaining block which provides a voltage to sustain the operation signal to an arbitrary interconnection overlapping the block switching unit.

19 Claims, 11 Drawing Sheets

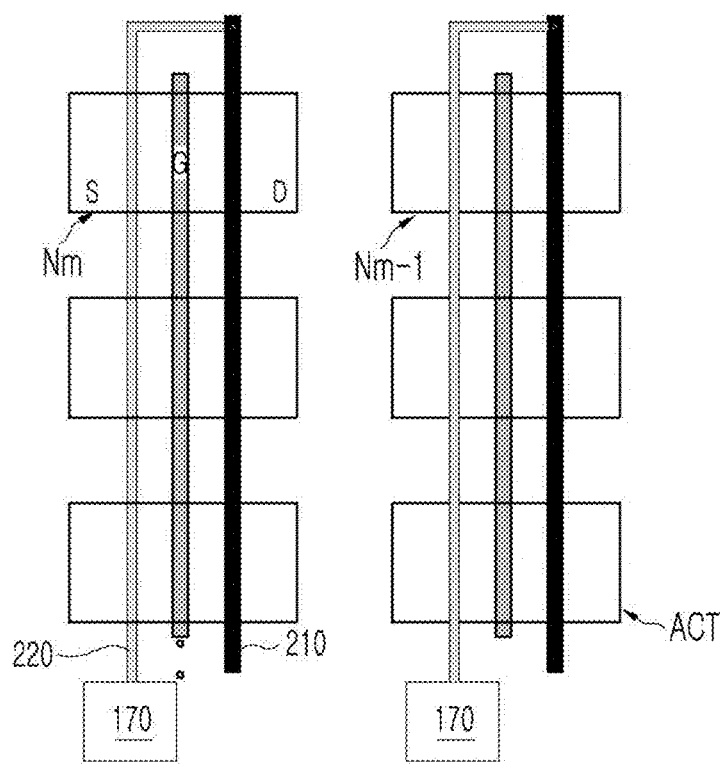

NONVOLATILE MEMORY DEVICE WITH IMPROVED VOLTAGE DROP AND METHOD OF DRIVING THE SAME

CROSS-REFERENCES TO RELATED APPLICATION

This application claims priority under 35 U.S.C. 119(a) to Korean application No. 10-2014-0127537, filed on Sep. 24, 2014, in the Korean intellectual property Office, which is incorporated by reference in its entirety as set forth in full.

BACKGROUND

1. Technical Field

The inventive concept relates to a nonvolatile memory device, and more particularly, to a nonvolatile memory device for preventing voltage drop of a program voltage.

2. Related Art

Flash memory devices are representative devices of non-volatile memory devices in which data is retained when a power voltage is interrupted. In the flash memory devices, data can be electrically erased or programmed, and a refresh function for rewriting the data in a certain period is not necessary.

However, as the integration degree of the flash memory devices is increased, a voltage for programming data in a memory cell region is gradually dropped. The voltage drop of the program voltage may be caused by parasitic capacitance generated in the nonvolatile memory devices. Even when the program voltage of a high level is applied, the program voltage which substantially reaches a memory cell is lower than or equal to the preset program voltage of a high level. Therefore, the resistance distribution of a nonvolatile memory cell is dispersed according to the application of the program voltage lower than equal to the preset high voltage.

SUMMARY

According to an embodiment, there is provided a nonvolatile memory device. The nonvolatile memory device may include a block switching unit which transmits an operation signal to a memory cell array. The nonvolatile memory device also includes a voltage sustaining block which provides a voltage to sustain the operation signal to an arbitrary interconnection overlapping the block switching unit.

According to an embodiment, there is provided a nonvolatile memory device. The nonvolatile memory device may include a pass transistor which transmits a signal of a global word line to a cell word line according to a block selection signal. The nonvolatile memory device may also include a voltage sustaining block which applies a voltage greater than or equal to a threshold voltage of the pass transistor and less than or equal to the signal of the global word line, to an interconnection overlapping a source or drain of the pass transistor.

According to an embodiment, there is provided a method of driving nonvolatile memory device. The method may include providing a program sustaining voltage to an interconnection, which overlaps a junction region of a pass transistor, which transmits a program voltage to a memory cell array, with an insulating layer interposed therebetween in a program process of the nonvolatile memory device to reduce a parasitic capacitance.

BRIEF DESCRIPTION OF THE DRAWINGS

FIG. 7 is a schematic layout diagram illustrating a block switching unit according to an embodiment of the inventive concept;

DETAILED DESCRIPTION

Figure 1:
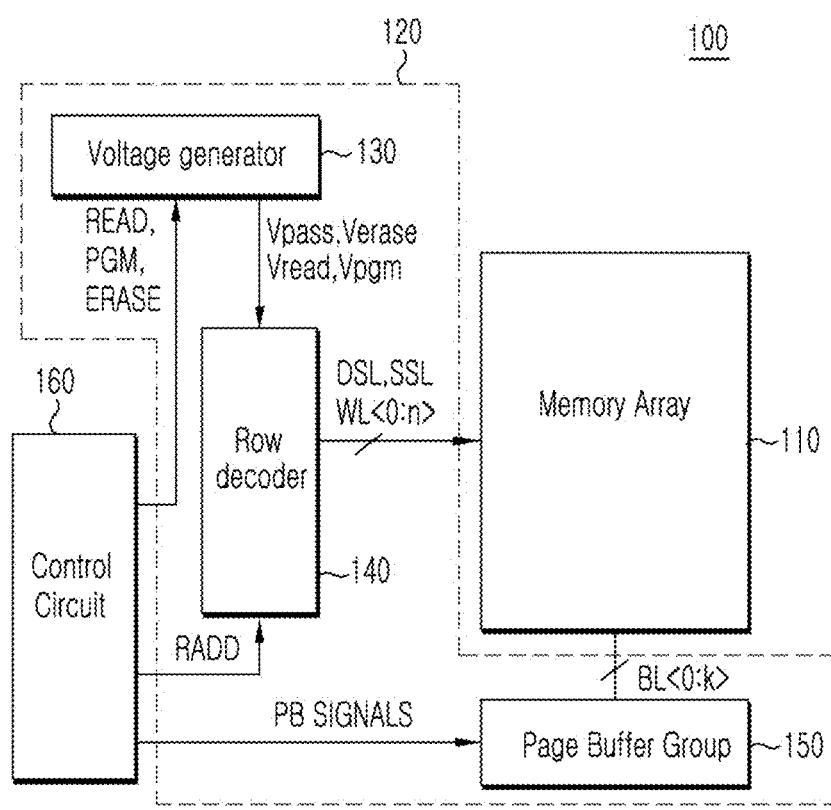
FIG. 1 is a schematic block diagram illustrating a nonvolatile memory device according to an embodiment of the inventive concept.

Hereinafter, embodiments will be described in greater detail with reference to the accompanying figures. Various embodiments are described with reference to cross-sectional illustrations that are schematic illustrations of embodiments (and intermediate structures). As such, variations from the shapes of the illustrations as a result, for example, of manufacturing techniques and/or tolerances, are to be expected. Thus, various embodiments should not be construed as limited to the particular shapes of regions illustrated but may be to include deviations in shapes that result, for example, from manufacturing. In the figures, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The inventive concept is described with reference to cross-section and/or plan illustrations that are schematic illustrations of embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these embodiments without departing from the principles and spirit of the inventive concept.

Referring to FIG. 1, a nonvolatile memory device 100 according to an embodiment may include a memory cell array 110, an operation circuit group 120, and a control circuit 160.

The memory cell array 110 may include a plurality of memory blocks. Each memory block may include a plurality of memory cells electrically coupled to local word lines and bit lines to store data.

The operation circuit group 120 may include a voltage generator 130, a row decoder 140, and a page buffer group 150. The voltage generator 130 and the row decoder 140 provide operation voltages required for a program operation, an erase operation, and a read operation of the memory cells according to signals READ, PGM, ERASE, and RADD provided from the control circuit 160.

The voltage generator 130 outputs operation voltages Vpass, Verase, Vread, and Vpgm for the program operation, the read operation and the erase operation of the memory cells to global lines according to the operation signals PGM, READ, and ERASE which are internal command signals of the control circuit 160.

The row decoder 140 transmits the operation voltages Vpass, Verase, Vread, and Vpgm generated in the voltage generator 130 to a selected memory block of the memory cell array 110 in response to row address signals RADD provided from the control circuit 160.

The page buffer group 150 may include page buffers electrically coupled to bit lines BL<0:k>, respectively. The bit lines BL<0:k> transmit voltages required to store data in the memory cells in response to control signals PB SIGNALS provided from the control circuit 160.

Figure 2:
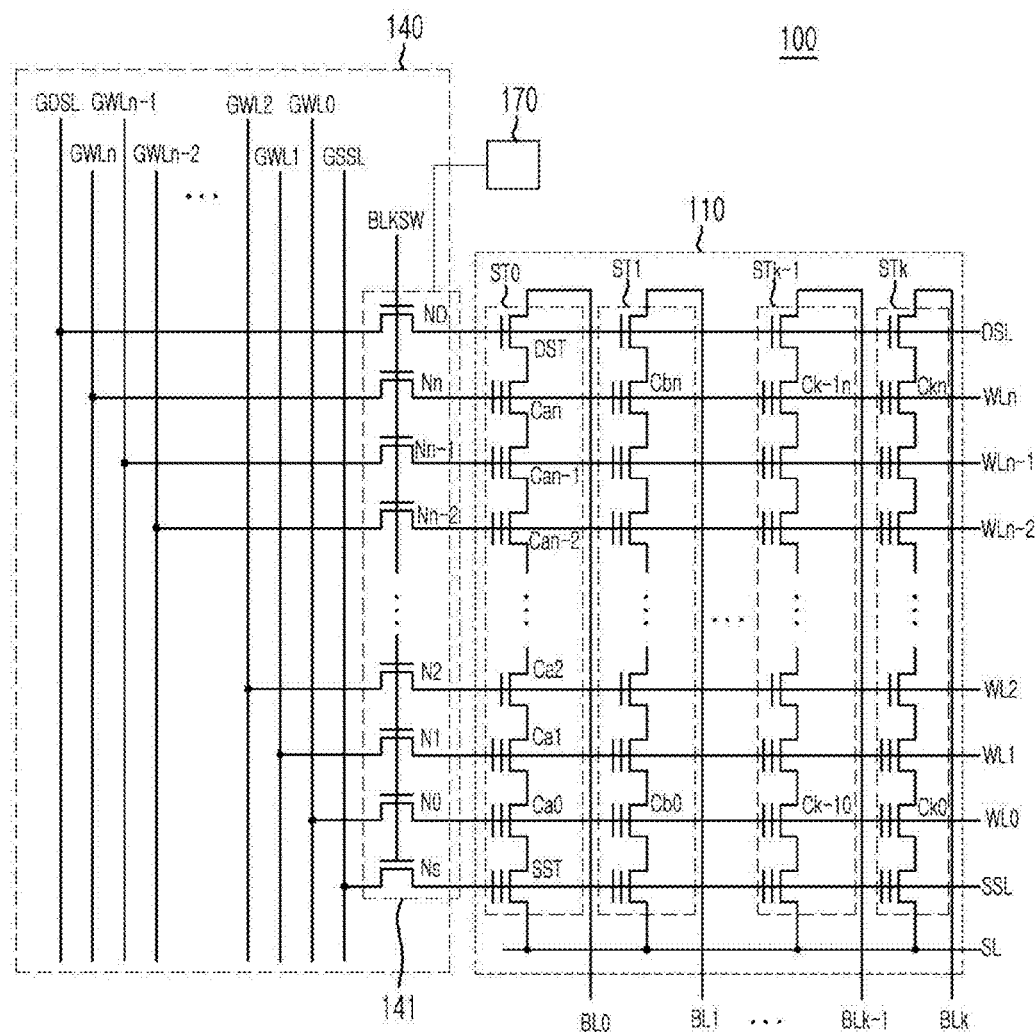
FIG. 2 is a circuit diagram illustrating a nonvolatile memory device according to an embodiment of the inventive concept.

The nonvolatile memory device 100 will be described in detail with reference to FIG. 2. Referring to FIG. 2, The selected memory block of the memory cell array 110 may include a plurality of strings ST<0:k> electrically coupled between a common source line SL and a plurality of bit lines BL<0:k>. Each of the strings ST0 to STk may include a source select transistor SST electrically coupled to the common source line SL; a drain select transistor DST electrically coupled to a corresponding bit line BL0 to BLk; and a plurality of cell transistors C<a0:an> to C<k0:kn> electrically coupled between the source select transistor SST and the drain select transistor DST. Each of the cell transistors C<a0:an> to C<k0:kn> may have a structure that includes a floating gate and a control gate.

The plurality of strings ST<0:k> constituting the memory block may be commonly electrically coupled to the common source line SL. Accordingly, the plurality of strings ST<0:k> may be electrically coupled to the common source line SL in parallel. The plurality of strings ST<0:k> constituting the memory block may be electrically coupled to corresponding bit lines BL<0:k> respectively. Gates of the source select transistors SST in the memory block may be commonly electrically coupled to the source select line SSL. In addition, gates of the drain select transistors DST in the memory block may be commonly electrically coupled to the drain select line DSL. Gates of the cell transistors C<a0:an> to C<k0:kn> constituting each of the strings ST<0:k> may be electrically coupled to a plurality of word lines WL<0:n> in a one-to-one correspondence. The source select line SSL, the drain select line DSL, and the word lines WL<0:n> electrically coupled to the memory cell array 110 may be referred to as local lines.

The row decoder 140 may include a block switching unit 141 driven in response to a block select signal BLKSW. The block switching unit 141 transmits signals loaded to global lines GDSL, GWL<0:n>, and GSSL to the local lines DSL, WL<0:n>, and SSL of the memory block in response to the block select signal BLKSW. The block switching unit 141 may include a plurality of pass transistors ND, N0 to Nn, and NS which electrically couple the global lines GDSL, GWL<0:n>, and GSSL and the local lines DSL, WL<0:n>, and SSL corresponding thereto. The plurality of pass transistors ND, N0 to Nn, and NS may be configured to operate in response to a block select signal BLKSW. Further, the block switching unit 141 may be configured to transmit an operation signal described above to the memory cell array 110.

Figure 3:
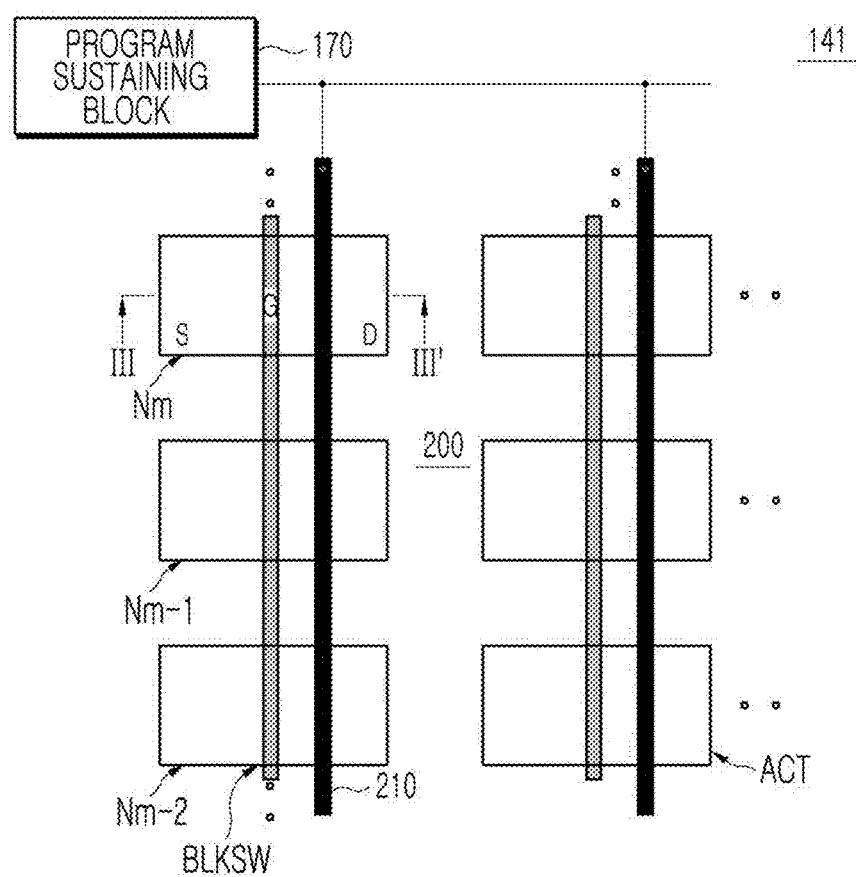
FIG. 3 is a schematic layout diagram illustrating a block switching unit according to an embodiment of the inventive concept.
Figure 4:
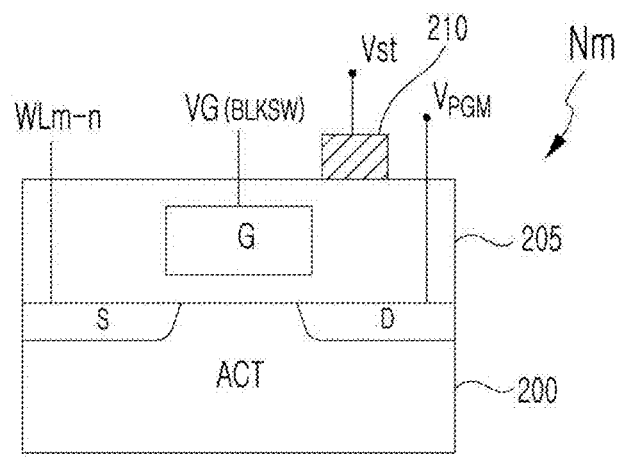
FIG. 4 is a cross-sectional view of the block switching unit taken along line III-III' of FIG. 3.

The pass transistors NS, N0 to Nn, and ND of the block switching unit 141 may be integrated in a matrix form on a semiconductor substrate 200 as illustrated in FIGS. 3 and 4. More specifically, active regions ACT of the plurality of pass transistors NS, N0 to Nn, and ND may be formed in a matrix form on the semiconductor substrate 200 at one side of a memory cell array region.

Gates G may be arranged to cross centers of the active regions ACT. The gates G may be electrically coupled in various forms according to a design scheme. Sources S and drains D are formed by implanting impurities into the active regions ACT at both sides of the gates G. Thus, pass transistors Nm, Nm–1, and Nm–2 are formed. The pass transistor Nm may be any one of the pass transistors constituting the block switching unit 141.

In general, a multi-layered interconnection structure is used to provide appropriate signals to electrodes of each transistor in a current semiconductor integrated circuit device. Even in the pass transistor Nm of an embodiment, the block select signal BLKSW may be applied to the gate G through the multi-layered interconnection structure. Further, the program voltage VPGM, that is, a global word line voltage GWLm may be applied through the drain D. In addition, a voltage, which is to be provided to the word line WLm, may be output through the source S. The pass transistor Nm may be configured to transmit a signal of the word line WLm to a cell word line in response to the block select signal BLKSW. Further, a signal of the word Line WLm has a voltage level of a program voltage VPGM for the memory cell array 110.

Further, in an embodiment, to prevent voltage drop of the program voltage VPGM, a program sustaining voltage Vst may be applied to at least one of interconnections 210 crossing junction regions of the pass transistors.

As described above, as the multi-layered interconnection structure is used in most of semiconductor integrated circuit devices, various interconnections may overlap the pass transistor Nm with an insulating layer 205 interposed therebetween. The program sustaining voltage Vst may be applied to at least one interconnection (hereinafter, referred to as a select interconnection 210) among interconnections not directly related to the driving of the pass transistor Nm and overlap the source S and drain D of the pass transistors ND, N0 to Nn, and NS. In an embodiment, for example, an arbitrary interconnection overlapping the drain D may be used as the select interconnection 210. When the program sustaining voltage Vst is applied to the select interconnection 210, a potential difference between the select interconnection 210 and the source S or the drain D overlapping the select interconnection 210 may be substantially reduced, and thus parasitic capacitance may be reduced.

The program sustaining voltage Vst may be set to, for example, a voltage which is greater than or equal to a threshold voltage of the pass transistor Nm and less than or equal to the program voltage VPGM to an arbitrary interconnection as the program sustaining voltage Vst to sustain the operation signal when the program voltage VPGM is applied to a memory cell array. The program sustaining voltage Vst may be provided from the program sustaining block 170. Moreover, the program sustaining block 170 may be configured to provide the program sustaining voltage Vst to an arbitrary interconnection that overlaps the block switching unit 141. The program sustaining voltage Vst may be greater than or equal to a threshold voltage of the pass transistor Nm and less than or equal to a voltage level of the signal of the word line WLm to an interconnection overlapping a source S or Drain D of the pass transistor WLm.

Figure 5:
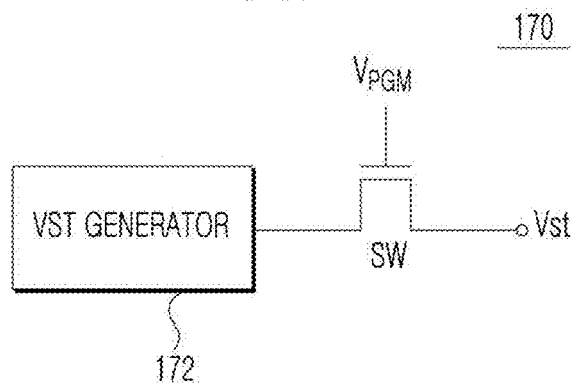
FIG. 5 is a schematic circuit diagram illustrating a program sustaining block according to an embodiment of the inventive concept.

The program sustaining block 170 may include a program sustaining voltage generator 172 and a switching transistor SW as illustrated in FIG. 5.

Figure 6A:
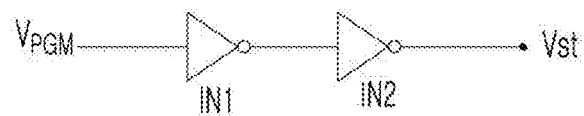
FIGS. 6A and 6B are circuit diagrams illustrating a program sustaining voltage generator according to an embodiment of the inventive concept.

The program sustaining voltage generator 172 may have a configuration for driving and buffering the program voltage VGM through a pair of inverters IN1 and IN2 as illustrated in FIG. 6A.

Figure 6B:
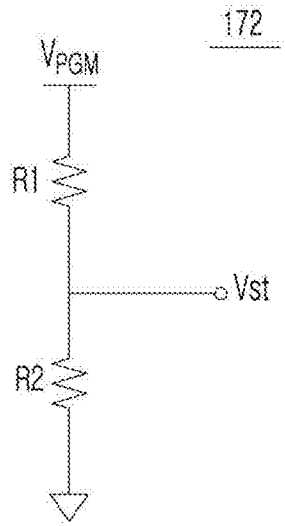

In the alternative, the program sustaining voltage generator 172 may be configured of a voltage divider circuit including a first resistor R1 and a second resistor R2 electrically coupled in series as illustrated in FIG. 6B. Resistances of the first and second resistors R1 and R2 may be set so that the program sustain voltage Vst may be greater than or equal to threshold voltages of the pass transistors ND, Nn to N0, and NS. The program sustaining voltage generator 172 may be configured to divide an operation signal mentioned above and output a voltage greater than or equal to the threshold voltages of the pass transistors ND, N0 to Nn, and NS.

Referring to FIG. 7, the program sustaining voltage Vst may be generated in the program sustaining voltage generator 172 in response to the program voltage VPGM to sustain an operation signal mentioned previously. The program sustaining voltage generator 172 may be configured to receive an operation signal mentioned above and buffer the operation signal accordingly. Since the program sustaining voltage Vst is generated using the program voltage VPGM, the program sustaining voltage Vst may have a certain delay with respect to the program voltage VPGM. The switching transistor SW may be configured to output the program sustaining voltage Vst in response to the program voltage VPGM to sustain a signal of the word line WLm. Further, as shown in FIGS. 6A and 6B, a level of the program sustaining voltage Vst may be determined according to the configuration of the program sustaining voltage generator 172.

Figure 8:
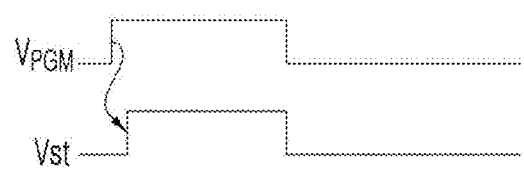
FIG. 8 is a timing chart illustrating a program sustaining voltage according to an embodiment of the inventive concept.

Referring to FIG. 8, to apply the program sustaining voltage Vst to the select interconnection 210, a routing interconnection 220 which connects the select interconnection 210 and the program sustaining block 170 may further included. More specifically, the program sustaining block 170 may be directly electrically coupled to the select interconnection 210 as shown in FIG. 3. Alternatively, the program sustaining block 170 may be electrically coupled to the select interconnection through the routing interconnection 220 as shown in FIG. 8. Further, the routing interconnection 220 may also overlap the source S or the drain D. Thus, when the program voltage is applied, parasitic capacitance due to interconnections overlapping the drain D and the source S may be reduced.

According to the inventive concept, when a program voltage of a NAND flash memory device is applied, the program sustaining voltage Vst is applied to an arbitrary interconnection overlapping the junction region of the pass transistor, which transmits a program voltage VPGM to the memory cell array 110. Accordingly, the parasitic capacitance generated in the junction region may be reduced to prevent the program error when programming a nonvolatile memory device.

The inventive concept is not limited to the program operation.

Figure 9:
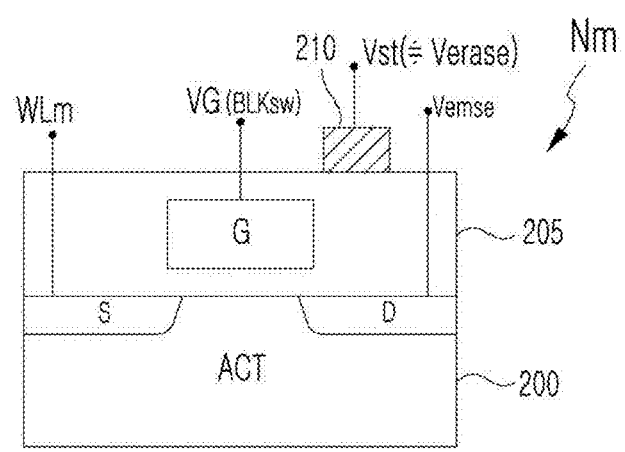
FIGS. 9 and 10 are cross-sectional views illustrating a pass transistor according to an embodiment of the inventive concept.

For example, the principle of the inventive concept may also be applied to an erase process and a read process. More specifically, as illustrated in FIG. 9, in the erase process of the memory cell array, a bias substantially having the same level as the voltage Verase applied to the drain of the pass transistor Nm may be applied to the select interconnection 210. More specifically, the program sustaining block 170 may be configured to provide a voltage with substantially the same level as an Verase operation voltage to an arbitrary or the select interconnection 210 when the Verase operation voltage is applied to the memory cell array 110. FIG. 9 also illustrates voltages VG and Vemse.

Figure 10:
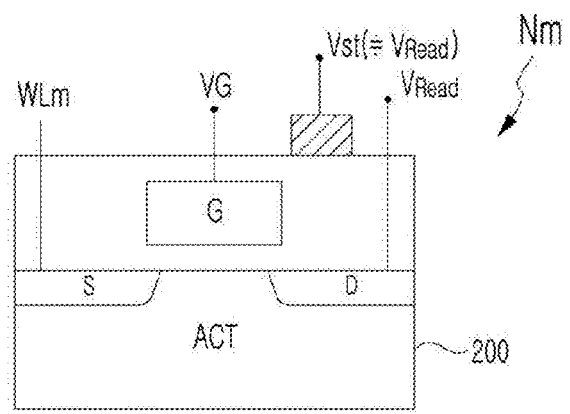

Similarly, as illustrated in FIG. 10, in the read process of the memory cell array, a bias substantially having the same level as the voltage Vread applied to the drain of the pass transistor Nm may be applied to the select interconnection 210. The program sustaining block 170 may be configured to provide a voltage with substantially the same level as a Vread operation voltage to the selection interconnection 210 when the Vread operation voltage is applied to the memory cell array 110.

Thus, the parasitic capacitance may be reduced in the operation period of the flash memory device.

Figure 11:
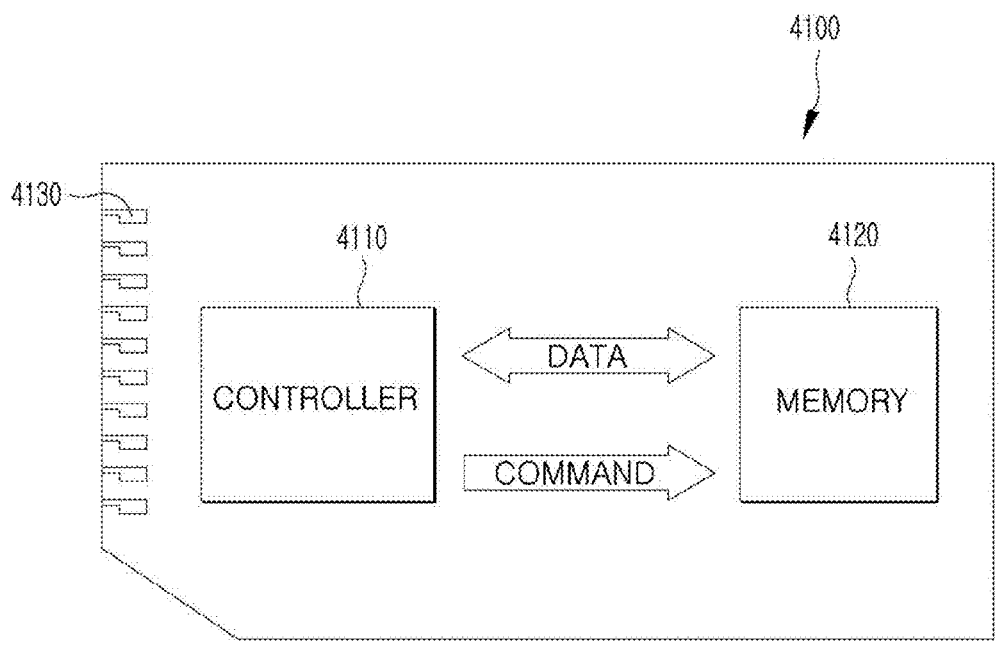
FIG. 11 is a schematic diagram illustrating a representation of an example of a memory card according to an embodiment of the inventive concept.

Referring to FIG. 11, a schematic diagram illustrating a representation of an example of a memory card having a semiconductor device according to various embodiments of the invention is shown.

In FIG. 11, a memory card system 4100 including a controller 4110, a memory 4120, and an interface member 4130 may be provided. The controller 4110 and the memory 4120 may be configured to exchange a command and/or data. For example, the memory 4120 may be used to store a command to be executed by the controller 4110 and/or user data.

The memory card system 4100 may store data in the memory 4120 or output data from the memory 4120 to the outside. The memory 4120 may include a semiconductor device according to any one of the above-described embodiments.

The interface member 4130 may function to input and output data from and to the outside. The memory card system 4100 may be a multimedia card (MMC), a secure digital card (SD) or a portable data storage device.

Figure 12:
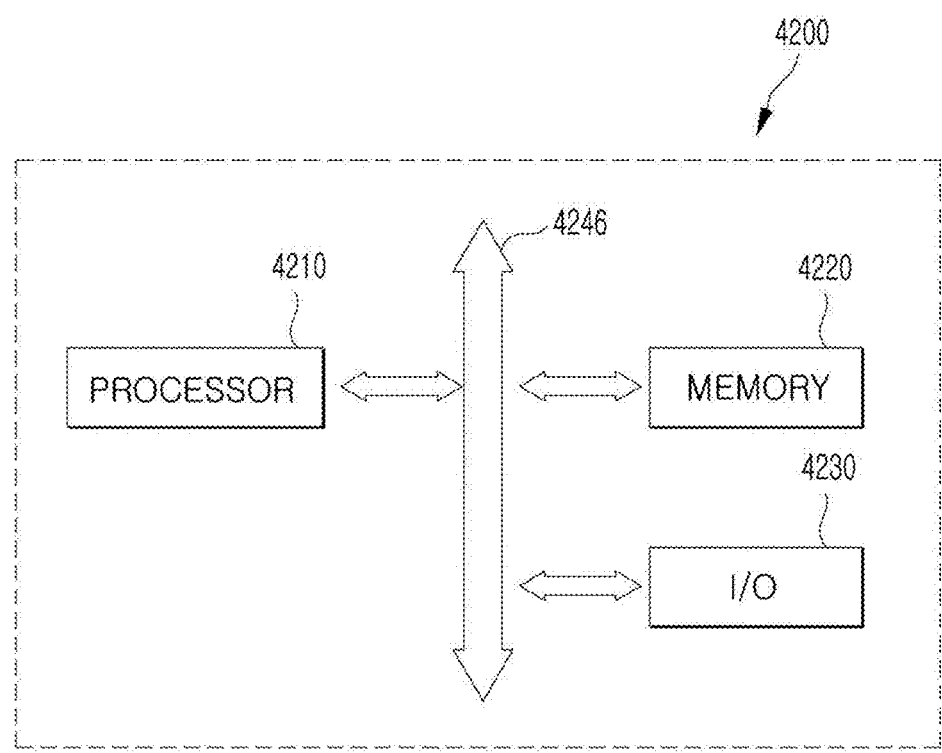
FIG. 12 is a block diagram illustrating a representation of an example of an electronic system according to an embodiment of the inventive concept.

Referring to FIG. 12, a block diagram illustrating a representation of an example of an electronic apparatus having a semiconductor device according to various embodiments of the invention is shown.

In FIG. 12, an electronic apparatus 4200 including a processor 4210, a memory 4220, and an input/output (I/O) device 4230 is illustrated. The processor 4210, the memory 4220, and the I/O device 4230 may be electrically coupled through a bus 4246.

The memory 4220 may receive a control signal from the processor 4210. The memory 4220 may store a code and data for the operation of the processor 4210. The memory 4220 may be used to store data to be accessed through the bus 4246.

The memory 4220 may include a semiconductor device according to any one of the above-described embodiments. In order for detailed realization and modification, additional circuits and control signals may be provided.

The electronic apparatus 4200 may constitute various electronic control apparatuses which need the memory 4220. For example, the electronic apparatus 4200 may be used in a computer system or a wireless communication device, such as a personal digital assistant (PDA), a laptop computer, a portable computer, a web tablet, a wireless phone, a portable phone, a digital music player, an MP3 player, a navigator, a solid state disk (SSD), a household appliance, or any device capable of transmitting and receiving information under wireless circumstances.

Descriptions will be made below for the detailed realization and modified examples of the electronic apparatus 4200, with reference to FIGS. 13 and 14.

Figure 13:
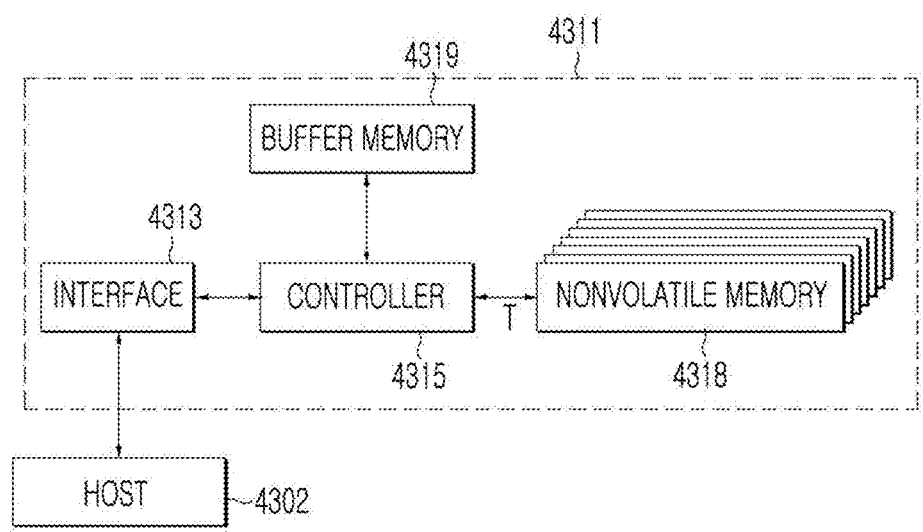
FIG. 13 is a block diagram illustrating a representation of an example of a data storage apparatus according to an embodiment of the inventive concept.

Referring to FIG. 13, a block diagram illustrating a representation of an example of a data storage apparatus having a semiconductor device according to various embodiments of the invention is described.

In FIG. 13, a data storage apparatus 4311 such as a solid state disk (SSD) may be provided. The SSD 4311 may include an interface 4313, a controller 4315, a nonvolatile memory 4318, and a buffer memory 4319.

The SSD 4311 is an apparatus which stores information using a semiconductor device. The solid state disk 4311 is faster, has a lower mechanical delay or failure rate, and generates less heat and noise than a hard disk drive (HDD). Further, the SSD 4311 may be smaller and lighter than the HDD. The SSD 4311 may be widely used in a notebook PC, a net book, a desktop PC, an MP3 player, or a portable storage device.

The controller 4315 may be formed adjacent to the interface 4313 and may be electrically coupled to the interface 4313. The controller 4315 may be a microprocessor including a memory controller and a buffer controller. The nonvolatile memory 4318 may be formed adjacent to the controller 4315. The nonvolatile memory 4318 may also be electrically coupled to the controller 4315 via a connection terminal T. The data storage capacity of the SSD 4311 may correspond to the nonvolatile memory 4318. The buffer memory 4319 may be formed adjacent to the controller 4315 and may be electrically coupled to the controller 4315.

The interface 4313 may be electrically coupled to a host 4302. Further, the interface 4313 may function to transmit and receive electrical signals such as data. For example, the interface 4313 may be a device which uses the same standard as SATA, IDE, SCSI, and/or a combination thereof. The nonvolatile memory 4318 may be electrically coupled to the interface 4313 via the controller 4315.

The nonvolatile memory 4318 may function to store the data received through the interface 4313.

The nonvolatile memory 4318 may include a semiconductor device according to any one of the above-described embodiments. The nonvolatile memory 4318 has a characteristic that the data stored therein are retained even when power supply to the SSD 4311 is interrupted.

The buffer memory 4319 may include a volatile memory. The volatile memory may be a DRAM and/or an SRAM. The buffer memory 4319 has relatively higher operation speed than the nonvolatile memory 4318.

The data processing speed of the interface 4313 may be relatively faster than the operation speed of the nonvolatile memory 4318. The buffer memory 4319 may function to temporarily store data. The data received through the interface 4313 may be temporarily stored in the buffer memory 4319 via the controller 4315. Further, the data then, may be permanently stored in the nonvolatile memory 4318 in conformity with the data recording speed of the nonvolatile memory 4318.

The data frequently used among the data stored in the nonvolatile memory 4318 may be read in advance and may be temporarily stored in the buffer memory 4319. More specifically, the buffer memory 4319 may function to increase the effective operation speed of the SSD 4311 and reduce an error occurrence rate.

Figure 14:
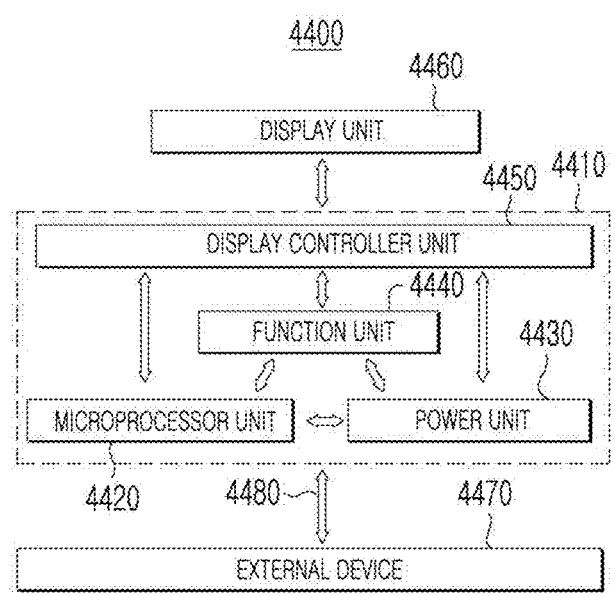
FIG. 14 is a block diagram illustrating a representation of an example of an electronic apparatus according to an embodiment of the inventive concept.

Referring to FIG. 14, a block diagram illustrating a representation of an example of an electronic apparatus having a semiconductor device according to various embodiments of the invention is described.

In FIG. 14, an electronic system 4400 including a body 4410, a microprocessor unit 4420, a power unit 4430, a function unit 4440, and a display controller unit 4450 is shown.

The body 4410 may be a mother board formed of a printed circuit board (PCB). The microprocessor unit 4420, the power unit 4430, the function unit 4440, and the display controller unit 4450 may be mounted on the body 4410. A display unit 4460 may be disposed inside the body 4410 or outside the body 4410. For example, the display unit 4460 may be disposed on a surface of the body 4410. Further, the display unit 4460 may display the image processed by the display controller unit 4450.

The power unit 4430 may function to receive a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430 and control the function unit 4440 and the display unit 4460. The function unit 4440 may perform various functions of the electronic system 4400. For instance, when the electronic system 4400 is a portable phone, the function unit 4440 may include various components capable of performing portable phone functions, such as output of an image to the display unit 4460 or output of a voice to a speaker, by dialing or communication with an external device 4470. When a camera is mounted together, the function unit 4440 may serve as a camera image processor.

When the electronic system 4400 is electrically coupled to a memory card or the like to increase capacity, the function unit 4440 may be a memory card controller. The function unit 4440 may exchange signals with the external device 4470 through a wired or wireless communication unit 4480. When the electronic system 4400 needs a universal serial bus (USB) or the like to expand functions thereof, the function unit 4440 may serve as an interface controller. Any one semiconductor device among the semiconductor devices according to the above-described embodiments may be applied to at least any one of the microprocessor unit 4420 and the function unit 4440.

The above embodiment of the invention is illustrative and not limitative. Various alternatives and equivalents are possible. The invention is not limited by the embodiment described above, nor is the invention limited to any specific type of semiconductor device. Other additions, subtractions, or modifications are obvious in view of the disclosure and are intended to fall within the scope of the appended claims.

What is claimed is:

1. A semiconductor integrated circuit device comprising:
a block switching unit configured to transmit an operation signal to a memory cell array, wherein the block switching unit includes a plurality of pass transistors;
a voltage sustaining block configured to generate a voltage to sustain the operation signal; and
an arbitrary interconnection configured to receive the voltage to sustain the operation signal and extended to be overlapped drains of the plurality of pass transistors,
wherein the arbitrary interconnection is parallel to a gate of the plurality of pass transistors.

2. The semiconductor integrated circuit device of claim 1, wherein the plurality of pass transistors are configured to operate in response to a block selection signal.

3. The semiconductor integrated circuit device of claim 2, wherein the voltage sustaining block provides a voltage, greater than or equal to threshold voltages of the pass transistors and less than or equal to a program voltage, to the arbitrary interconnection as the voltage to sustain the operation signal when the program voltage is applied to the memory cell array.

4. The semiconductor integrated circuit device of claim 3, wherein the voltage sustaining block includes:
   a circuit unit configured to generate the voltage for sustaining the operation signal; and
   a switch configured to output the voltage for sustaining the operation signal in response to the program voltage.

5. The semiconductor integrated circuit device of claim 4, wherein the circuit unit is configured to receive the operation signal and buffer the operation signal.

6. The semiconductor integrated circuit device of claim 4, wherein the circuit unit is configured to divide the operation signal and output the voltage greater than or equal to the threshold voltages of the pass transistors.

7. The semiconductor integrated circuit device of claim 2, wherein the voltage sustaining block is configured to provide a voltage with substantially a same level as an erase voltage to the arbitrary interconnection when the erase voltage is applied to the memory cell array.

8. The method of claim 2, wherein the voltage sustaining block is configured to provide a voltage substantially having a same level as a read voltage to the arbitrary interconnection when the read voltage is applied to the memory cell array.

9. The semiconductor integrated circuit device of claim 1, wherein the arbitrary interconnection is electrically coupled to the voltage sustaining block through a routing interconnection.

10. The semiconductor integrated circuit device of claim 9, wherein the routing interconnection is configured to overlap the sources of the plurality of pass transistors.

11. A semiconductor integrated circuit device comprising:
   a pass transistor configured to transmit a signal of a global word line to a cell word line according to a block selection signal;
   a voltage sustaining block configured to generate a program sustaining voltage greater than or equal to a threshold voltage of the pass transistor and is less than or equal to a voltage level of the signal of the global word line, and
   an interconnection arranged to overlap drain of the pass transistor and to be parallel to a gate of the pass transistor,
   wherein the interconnection is electrically connected with the voltage sustaining block and receives the program sustaining voltage.

12. The semiconductor integrated circuit device of claim 11, wherein the signal of the global word line has the voltage level of a program voltage for a memory cell array.

13. The semiconductor integrated circuit device of claim 12, wherein the voltage sustaining block includes:
   a circuit unit configured to generate the program sustaining voltage for sustaining the signal of the global word line;
   a switch configured to output the program sustaining voltage in response to the program voltage.

14. The semiconductor integrated circuit device of claim 13, wherein the circuit unit is configured to receive the program sustaining voltage and buffer the received program sustaining voltage.

15. The semiconductor integrated circuit device of claim 13, wherein the circuit unit is configured to divide the program sustaining voltage and output the program sustaining voltage greater than or equal to the threshold voltage of the pass transistor.

16. The semiconductor integrated circuit device of claim 11, wherein the interconnection is electrically coupled to the voltage sustaining block through a routing interconnection, and the routing interconnection is configured to overlap the source or drain.

17. The semiconductor integrated circuit device of claim 11, further comprising a routing interconnection electrically coupled to the interconnection and configured to be routed to overlap another junction of the pass transistor,
   wherein a program voltage is applied to the routing interconnection.

18. The semiconductor integrated device according of claim 11, wherein the program voltage with substantially a same level as a read voltage applied to the pass transistor is also applied to the interconnection.

19. A method of driving a semiconductor integrated circuit device, the method comprising:
   providing a program sustaining voltage to an interconnection overlapping a junction region of a pass transistor, which transmits a program voltage to a memory cell array, with an insulating layer interposed therebetween when programming a nonvolatile memory device to reduce a parasitic capacitance,
   wherein the program sustaining voltage has a level greater than or equal to a threshold voltage of the pass transistor and less than or equal to the program voltage.

* * * * *